United States Patent [19]
Ishikawa

[11] Patent Number: 4,995,059
[45] Date of Patent: Feb. 19, 1991

[54] PREDICTIVE CODING DEVICE
[75] Inventor: Hisashi Ishikawa, Sagamihara, Japan
[73] Assignee: Canon Kabushiki Kaisha, Tokyo, Japan
[21] Appl. No.: 288,994
[22] Filed: Dec. 23, 1988
[30] Foreign Application Priority Data
  Jan. 14, 1988 [JP] Japan .................... 63-6069
  Feb. 24, 1988 [JP] Japan ................... 63-41455
[51] Int. Cl.⁵ ........................... H04B 14/06
[52] U.S. Cl. .................... 375/27; 341/106; 375/94
[58] Field of Search ......... 375/27, 25, 26, 94; 358/13; 341/143, 200, 76, 106; 379/339, 39

[56] References Cited
U.S. PATENT DOCUMENTS

| | | | |
|---|---|---|---|
| 4,430,670 | 2/1984 | Netravali | 375/26 X |
| 4,540,973 | 9/1985 | Grallert | |
| 4,742,391 | 5/1988 | Sorgi et al. | 358/133 |
| 4,743,967 | 5/1988 | Takenaka et al. | 375/27 X |
| 4,791,483 | 12/1988 | Miller | 375/27 X |
| 4,827,340 | 5/1989 | Pirsch | 375/27 X |
| 4,852,125 | 7/1989 | Suzuki | 375/30 |
| 4,860,314 | 8/1989 | Boisson | 375/27 |

FOREIGN PATENT DOCUMENTS
0117525 9/1984 European Pat. Off. .
2191653 12/1987 United Kingdom .
2208339 3/1989 United Kingdom .

Primary Examiner—Benedict V. Safourek
Assistant Examiner—Tesfaldet Bocure
Attorney, Agent, or Firm—Fitzpatrick, Cella, Harper & Scinto

[57] ABSTRACT

A predictive coding device has an input terminal through which a sampled value is input, a predicting circuit for outputting a predicted value for the sampled value which has been input through the input terminal, and a look-up table arranged to receive, as a readout address, the sampled value input through the input terminal and the predicted value and then to output a predictive coded value. On the basis of the input sampled value and the predicted value, the predictive coding device determines the readout address for the look-up table which stores a table providing the predictive coded value.

17 Claims, 4 Drawing Sheets

PREDICTIVE CODING DEVICE

BACKGROUND OF THE INVENTION

1. Field of the Invention

The present invention relates to a predictive coding device and, more particularly, to a coding device suitable for use in digital transmission of a voice, an image and so forth.

2. Description of the Prior Art

It has been proposed to provide various coding methods in order to reduce the amount of data transmitted during digital transmission of information such as image or voice information. Differential pulse-code modulation (hereinafter referred to as "DPCM") is one known example of such a coding method in which the amount of information is reduced by utilizing the correlations between adjacent sampled values.

As is well known, in DPCM, a coded sampled value is decoded, the decoded value is then used to obtain a predicted value for the succeeding sampled value to be coded, and then the error between the predicted value and the succeeding actual sampled value is quantized and coded.

FIG. 1 is a block diagram showing the construction of a DPCM coding device based on first-order prediction, which is the most simple. A sampled value $X_i$ is input through an input terminal 1 and applied to a subtractor 2, where a predicted value (in this example, a first-order decoded value) which will be described later is subtracted from the sampled value $X_i$. A quantizer 3 quantizes the differential value output from the subtractor 2 and supplies the quantized differential to an output terminal 8 as a DPCM code $Y_i$. Simultaneously, the DPCM code $Y_i$ is applied to an inverse quantizer 4. The inverse quantizer 4 decodes the DPCM code $Y_i$ into the differential value and applies it to an adder 5. In the adder 5, the first-order predicted value applied to the subtractor 2 is added to the differential value, and thus the original sampled value is recovered from the differential value. A limiter 6 limits the amplitude of the output of the adder 5 within a predetermined range and supplies the result to a D-type flip flop 7. The output of the D-type flip flop 7 is supplied to the subtractor 2 and the adder 5 as the predicted value for the succeeding sampled value.

In general, the distribution of differential values with respect to first-order predicted values is biased to a small-value portion. Accordingly, if the differential values are coded and transmitted, information can be transmitted in a compressed form.

However, in a case where signals of high sampling frequencies such as HDTV (high-definition television) signals are handled, even if a high-speed logic IC is used, it is impossible to complete, within one sampling period, the requisite arithmetic operations within a DPCM loop (the loop from the input of the sample value $X_i$ to the finding of a local decoded value which is the input to the D-type flip flop 7). For this reason, in order to handle such signals of high sampling frequencies, it is necessary to incorporate parallel processing. For example, for the case of a sampling frequency of 48.6 MHz, the sampling period is 20.5 ns. In this case, even if "FAST" which is a high-speed TTL-IC is used as a logic IC and even if a high-speed PROM is used as the quantizer 4, approximately 165 ns will be needed as the time interval for completing all the arithmetic operations within the, DPCM loop. Since $165/20.5=8.05$, the number of parallel processings is nine, that is to say, nine identical circuits are required. As a matter of course, if even more complex processing is to be performed, the number of parallel processings most be increased even further. In addition, if the parallel processing is adopted, a circuit for dividing a signal into nine phases and a circuit for multiplexing the nine signals thus divided would also be required. As a result, the construction of the requisite hardware becomes complicated and the scale thereof extremely large.

Furthermore, if the quantizing characteristics of the quantizer are to be altered so that a coding device having the above-described arrangement may be adapted to various applications, the hardware construction of the quantizer itself must also be changed. Accordingly, it has heretofore been very difficult to change the quantization characteristics.

SUMMARY OF THE INVENTION

It is, therefore, a first object of the present invention to solve the above-described problem.

It is a second object of the present invention to provide a predictive coding device which has a simplified hardware construction and which is capable of effecting high-speed coding.

It is a third object of the present invention to provide a predictive coding device which can be adapted to various applications and which has a simplified circuit construction.

To achieve the first and second objects, in one embodiment of the present invention, there is provided a predictive coding device which comprises input means arranged to input a sampled value, predicting means for outputting a predicted value for the sampled value which has been input through the input means, and a look-up table arranged to receive, as a readout address, the sampled value input through the input means and the predictive value and then to output a predicted coded value.

To achieve the third object, in another embodiment of the present invention, there is provided a predictive coding device which comprises input means arranged to input a sampled value, predicting means for outputting a predicted value for the sampled value which has been input through the input means, a random access memory arranged to receive, as a readout address, the sampled value input through the input means and the predicted value and then to output a predictive coded value, and loading means for loading a table containing the predictive coded value into the random access memory.

The above and other objects, features and advantages of the present invention will become apparent from the following detailed description of the preferred embodiments thereof, taken in conjunction with the accompanying drawing.

BRIEF DESCRIPTION CF THE DRAWINGS

DESCRIPTION OF THE PREFERRED EMBODIMENTS

The preferred embodiments of the present invention will be described below with reference to FIGS. 2 through 6.

Figure 1:
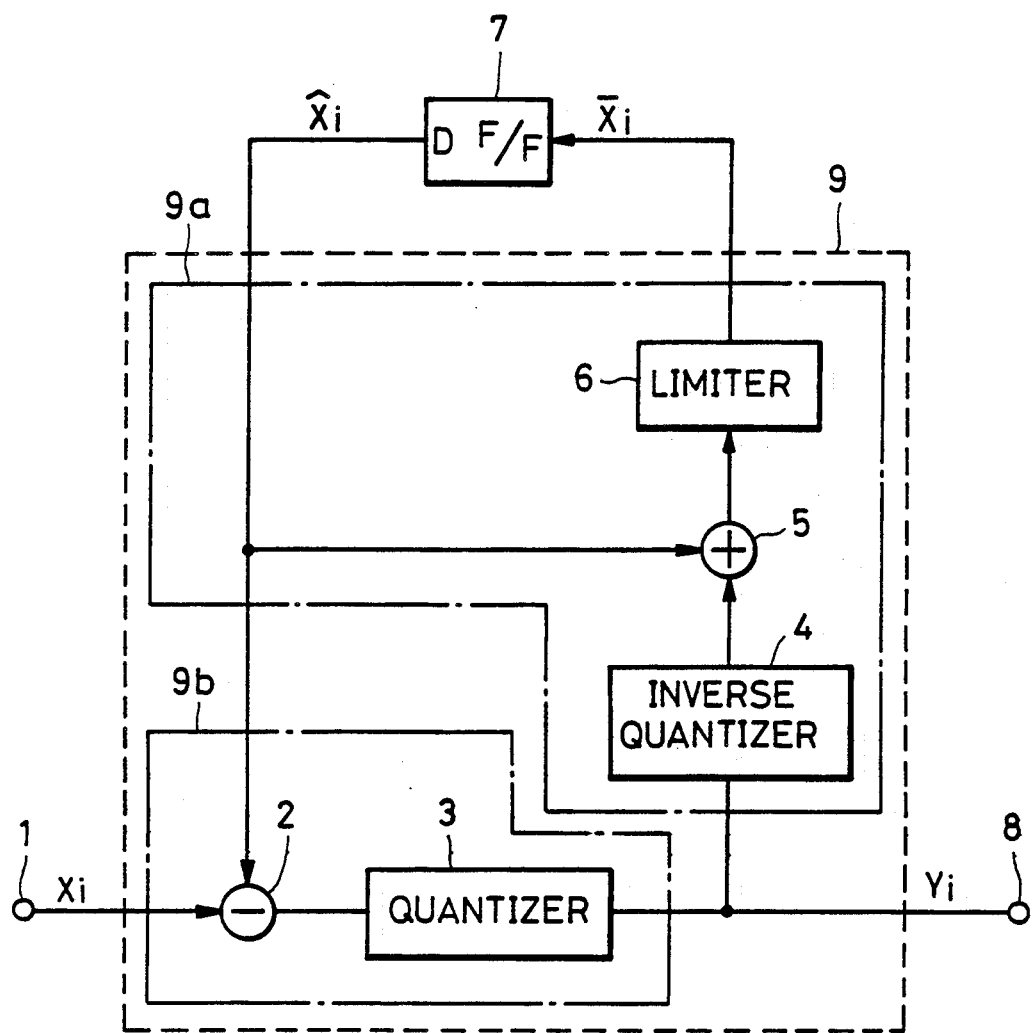
FIG. 1 is a block diagram showing an example of the construction of a conventional type of DPCM coding device.
Figure 2:
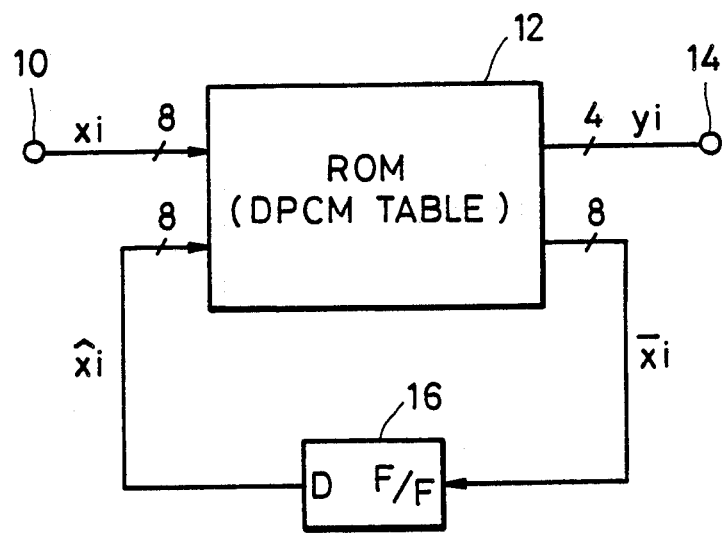
FIG. 2 is a block diagram showing the construction of a coding device according to a first embodiment of the present invention.

FIG. 2 is a block diagram showing the construction of a predictive coding device according to a first embodiment of the present invention. The first embodiment includes an input terminal 10 for receiving an 8-bit sampled value $x_i$, a ROM (read-only memory) 12 that stores, in the form of a table, data representative of the arithmetic operations required for DPCM processing, an output terminal 14 through which a 4-bit DPCM code $y_i$ is output, and a D-type flip flop 16 which performs the same function as the D-type flip flop 7 of FIG. 1. The input sampled value $x_i$ from the input terminal 10 and a predicted value $x_i$ are supplied to an address input of the ROM 12. In consequence, the 8-bit input sampled value $x_i$ and the 8-bit predicted value $x_i$ are combined into a 16-bit address signal for the ROM 12.

The ROM 12 stores in advance DPCM codes and local decoded values which are associated with combinations of the input sampled value $x_i$ and the predicted value $x_i$. Such input-output relationship can be determined purely mathematically, and it is not excessively difficult to obtain each value in the table. In response to an address signal consisting of the input sampled value $x_i$ and the predicted value $x_i$, the ROM 12 outputs the corresponding DPCM code and local decoded value to the output terminal 14 and the D-type flip flop 16, respectively. The time period required for this output is extremely short, concretely one readout cycle time.

The primary difference between the circuits of FIGS. 1 and 2 resides in the fact that the table in the ROM 12 performs the processing of the circuits which are arranged in a block 9 defined by a dashed line FIG. 1.

If it is assumed that the input sampled value $x_i$ is 8 bits and the DPCM code $y_i$ is 4 bits (the compression ratio: ½), the capacity of the ROM 12 which is required to construct the table described above is 64K×12 bits. Presently, ROMs of large capacity have been developed by utilizing MOS-LSI technology. If, for example, a ROM of 32×8 (whose access time is 70 ns) is employed, the number of IC's required to realize the ROM 12 is 2×2+2=6, including two address decoding IC's. The number N of parallel processings is $[(70+8)/20.5]+1=4$ (where the square brackets denote that the number between is rounded to the next integer of equal or lower value); and the total number of IC's used in the overall DPCM circuit is 6×4=24. In a case where a logic IC is used, as in the conventional example, the number of parallel processings is nine and therefore the number of IC's increases at each processing section. In contrast, in the present embodiment, the number of IC's is about ⅓ that of the IC's used in the conventional example and, therefore, the number of IC's required can be greatly reduced.

In the future, if a ROM with an even higher processing speed and capacity is developed with further improvements in semiconductor technology, the amount of hardware needed will be reduced further.

It is to be noted that, if either the input sampled value $x_i$ or the predicted value $x_i$ is known, the dynamic range of the differential value can be compressed to about ½. More specifically, if the input value $x_i$ has n levels from 0 to n−1, the range of values which the differential value can take on corresponds to n levels with $(n-1-x_i)$ to $-x_i$. Accordingly, the dynamic range required in this embodiment is about half the dynamic range (2n−1) of the differential value described above in connection with the conventional example. For this reason, in the coding device of this embodiment, the individual values in the table are determined so that quantization can be effected in accordance with the dynamic range (n levels) based on the predicted value input to the ROM 12. Accordingly, the quantization of this embodiment is substantially equivalent to quantization employing twice as many levels as those used in the conventional DPCM coding device, whereby image quality can be greatly enhanced.

In the above-described embodiment, if input-output characteristics associated with coding operations are known, as long as the number of input bits and output bits are identical, the contents of coding operations can be changed by replacing the ROM 12 with a ROM having a table with a corresponding input-output relationship. In other words, the coding device of this embodiment can be adapted to a variety of coding devices without any need for the circuit wiring itself to be changed. In addition, if the number of input bits or output bits needs to be changed, it is sufficient that a ROM adapted to the desired number is prepared and the design is changed so as to accommodate the bit width of a signal channel. Accordingly, it will be appreciated that, as compared with the conventional example using a logic circuit constituted by a combination of logic IC's, the coding device the above embodiment enables changes in the contents of coding operations to be easily effected and can, therefore, be adapted to various applications.

Figure 3:
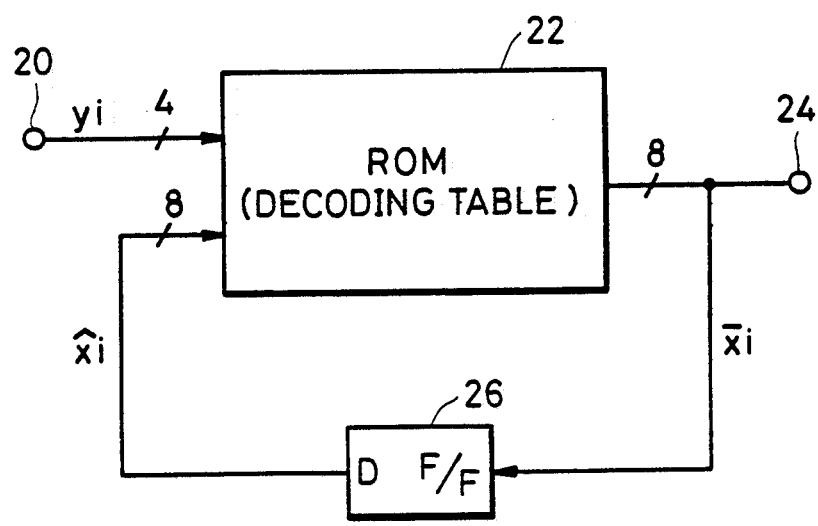
FIG. 3 is a block diagram showing the construction of a decoding device which corresponds to the coding device of FIG. 2.

FIG. 3 is a block diagram of a decoding device (on the receiving side) which corresponds to the coding device of FIG. 2. In the illustrated decoding device, an input terminal for receiving the DPCM code $y_i$ is denoted by reference numeral 20, and a ROM 22 stores a decoding table. When the DPCM code $y_i$ and the predicted value (first-order predicted value) $x_i$ (which will be described later) are input to the address section of the ROM 22, the ROM 22 provides a corresponding decoded value at an output terminal 24 with memory access time. Simultaneously, the decoded value output from the ROM 22 is applied to a D-type flip flop 26. The output of the D-type flip flop 26 is applied back to the ROM 22 as the predicted value $x_i$.

The table of the ROM 22 is determined in correspondence with the table of ROM 12 at the transmitting side. Accordingly, this embodiment is arranged to allow the range of inverse quantization for decoding to be determined in accordance with the predicted value.

For example, if it is assumed that the DPCM code $y_i$ is represented by 4 bits, the decoded value output from the ROM 22 by 8 bits, and the predicted value $x_i$ output from the D-type flip flop 26 by 8 bits, the capacity of the ROM 22 is 4K×8 and hence the decoding table can be realized by a single IC. Furthermore, since the cycle time of the ROM 42 is approximately 35 ns, the number of parallel processings is two. Accordingly, it is possible to greatly reduce the scale of the requisite hardware.

The above description refers to first-order predictive DPCM for the purpose of illustration, but the range of application of the embodiment described above is not limited to first-order prediction. For example, the embodiment can be adapted to various other DPCM schemes based on second-order prediction, third-order prediction and adaptive prediction. Furthermore, the embodiment can be adapted to coding schemes of the type which allows determination of arbitrary code length.

Figure 4:
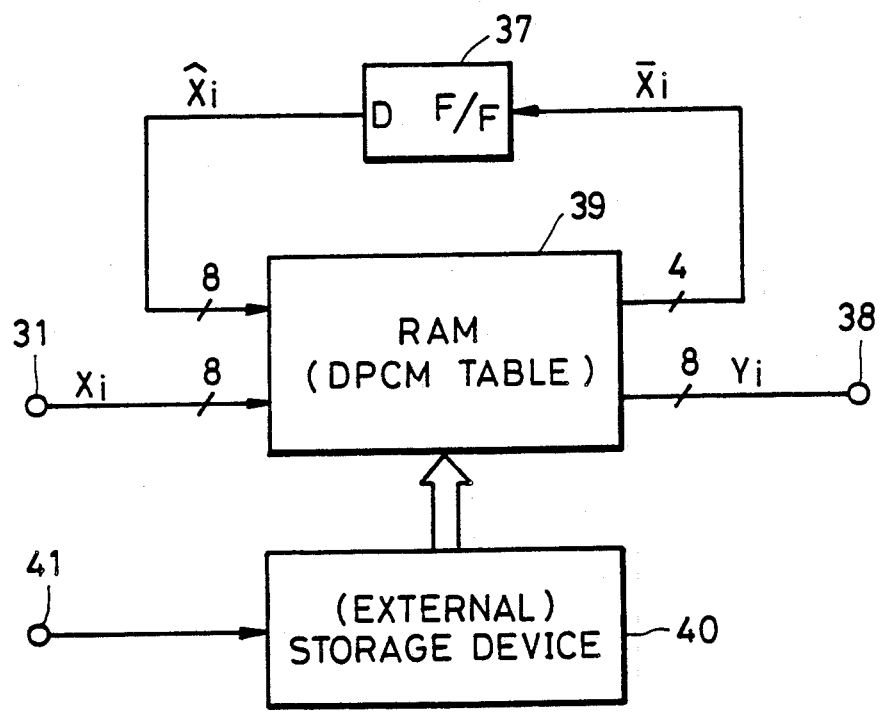
FIG. 4 is a block diagram showing the construction of a coding device according to a second embodiment of the present invention.

FIG. 4 is a block diagram showing the construction of the essential portion of a coding device according to a second embodiment of the present invention. The illustrated device includes an output terminal 31 for receiving the 8-bit sampled value $x_i$, a RAM (random access memory) 39, an output terminal 38 through which a DPCM code $y_i$ is output, and a D-type flip flop 37 which has a function similar to that of the D-type flip flop 7 of FIG. 1. An input sampled value $x_i$ at the input terminal 31 and an 8-bit predicted value $x_i$ output from the D-type flip flop 37 are supplied to corresponding address input of the RAM 39. In consequence, the 8-bit input sampled value $x_i$ and the 8-bit predicted value $x_i$ constitute an 16-bit address signal for the RAM 39.

In the external storage device 40, DPCM codes $y_i$ and local decoded values $\bar{x}_i$ corresponding to all patterns of input sampled values $x_i$ and predicted values $x_i$, determined based upon the predetermined characteristics, are stored in advance. The external storage device 40 is supplied with a load signal through a terminal 41, for example, after an electrical power source (not shown) has been switched on. In response to the load signal, the storage device 40 loads a DPCM table containing a DPCM coding code which is the result of predetermined DPCM arithmetic operations as well as a corresponding local decoded value into the RAM 39 in a sequential manner. The values can be determined purely mathematically, and it is not excessively difficult to find individual data in the table.

The storage device 40 may be of a type whose access time is long, only if it has storage capacity which can accommodate a predetermined DPCM table. For example, the storage device 40 may be constituted by a semiconductor memory such as an EPROM or a magnetic recording/reproducing device such as a magnetic disk.

In response to an address signal consisting of the input sample value $x_i$ and the predicted value $x_i$, the RAM 39 output DPCM code and a local decoded value to the output terminal 38 and the D-type flip flop 37, respectively. That is to say, the RAM 39 used in the embodiment shown in FIG. 4 performs the function of the block 9 shown by the dashed line in FIG. 1. The time period required for this output is extremely short, concretely one readout cycle time.

If it is assumed that the input sampled value $x_i$ is 8 bits with the DPCM code yi 4 bits (the compression ratio:$\frac{1}{2}$), the capacity of the RAM 39 which is required to construct the table described above is 64K×4 bits. Presently, SROMs of large capacity and high speed have been developed by various manufacturers. If, for example, a ROM having a capacity of 64K×8 bits and an access time of 35 ns is employed, the number of IC's required to construct the DPCM table is three. If the number of latch IC's and address decoding IC's required to load the DPCM table is included, the number of IC's per DPCM coder is eight (3+4+1). The number of parallel processings is two since 35 ns/20.5 ns = 1.7, and the total number of IC's used in the overall DPCM coder is 2×8=16.

If a logic IC is employed, as in the conventional example shown in FIG. 1, the number of parallel processings is nine and, therefore, the number of IC's used in the individual processing circuits increases. In contrast, since the number of IC's used in this embodiment is about 1/6 that of IC's used in the conventional example, the number of IC's required can be greatly reduced.

In the above-described embodiment, if input-output characteristics associated with coding operations are known, as long as the number of input bits and output bits are identical, then no matter how complex the algorithm, it can be realized by an identical circuit arrangement simply by updating the contents of the DPCM table. Further, since the table is constituted by the SRAM, it is very easy to alter algorithms. For example, in a case where a magnetic disk device is used as the storage device 40, the algorithm can be altered by the replacement of magnetic disks. Furthermore, since the external storage device 40 may be of a type whose access time is long, it is possible to use inexpensive and large-capacity storage such as a magnetic disk and hence to set a multiplicity of algorithms.

Figure 5:
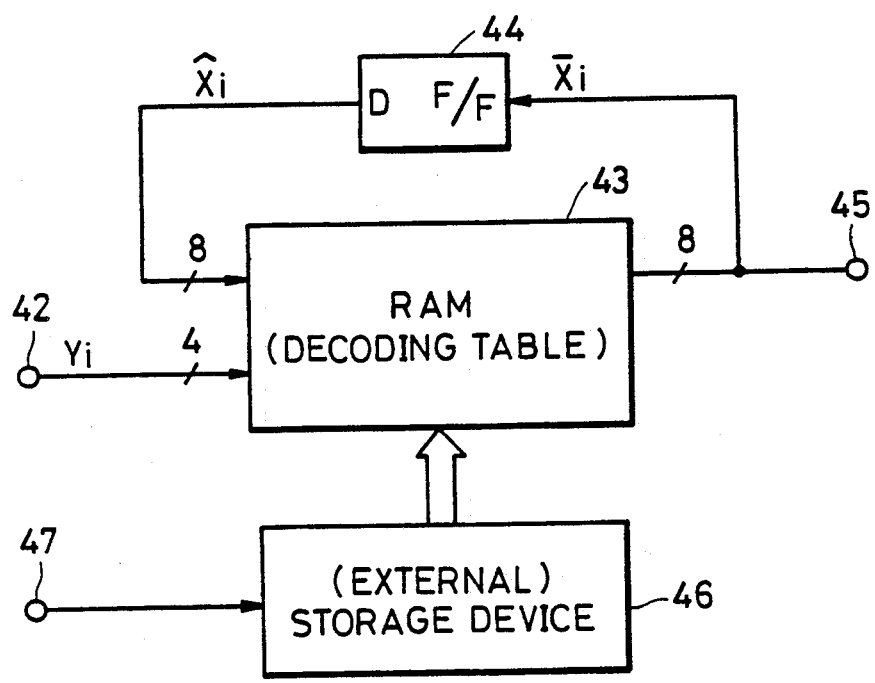
FIG. 5 is a block diagram showing the construction of a decoding device which corresponds to the coding of FIG. 4.

FIG. 5 is a block diagram of the construction of the essential portion of a decoding device which corresponds to the coding device of FIG. 4. In the illustrated decoding device, an input terminal for receiving the DPCM code $y_i$ transmitted from the above-described coding device is denoted by reference numeral 42. A RAM 43 stores a decoding table, and the DPCM code yi and the predicted value $x_i$ (which will be described later) are applied to corresponding address inputs of the RAM 43. An external storage device 46 is supplied with a load signal through a terminal 47, for example, after an electrical power source (not shown) has been switched on. In the external storage device 46, decoded values $\bar{x}_i$ corresponding to all patterns of DPCM codes $y_i$ and the predicted values $x_i$ determined based upon the predetermined characteristics are stored in advance. In response to the load signal, the storage device 46 loads a table containing DPCM decoded values into the RAM 43 in a sequential manner.

When the above-described DPCM code $y_i$ and predicted value $x_i$ are input to the RAM 43, the RAM 43 applies a corresponding decoded value in the loaded table to an output terminal 45. Simultaneously, the decoded value output from the RAM 43 is applied to a D-type flip flop 44. The output of the D-type flip flop 44 is applied to the RAM 43 as the predicted value $x_i$.

For example, if it is assumed that the DPCM code $y_i$ is constituted by 4 bits, the decoded value output from the RAM 43 by 8 bits, and the predicted value $x_i$ output from the D-type flip flop 44 by 8 bits, the capacity of the RAM 43 is 4K ×8 bits and hence the decoding table can be realized by using a single IC. Furthermore, since the cycle time of the RAM 43 is approximately 35 ns, the number of parallel processings is two. Accordingly, it is possible to greatly reduce the scale of the requisite hardware.

The table to be stored in the RAM 43 is determined in correspondence with the table stored in the RAM 39 at the transmitting side.

Figure 6:
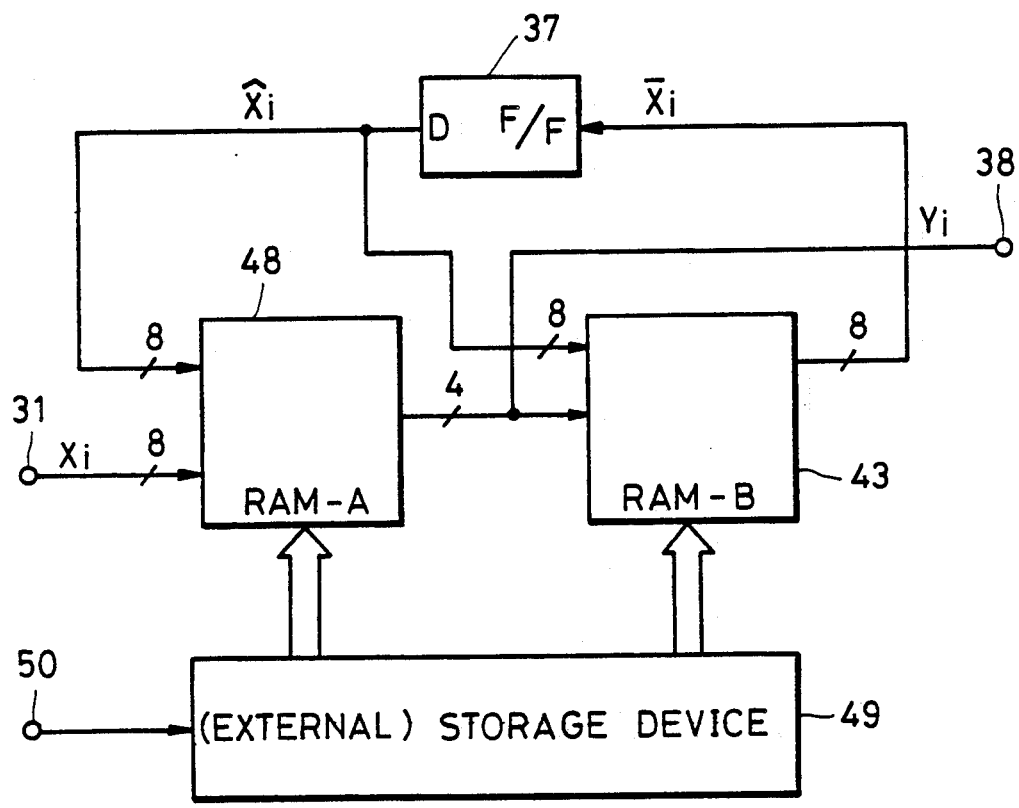
FIG. 6 is a block diagram showing the construction of a coding device according to a third embodiment of the present invention.

FIG. 6 is a block diagram showing the construction of the essential portion of a decoding device according to a third embodiment of the present invention. In this figure, the same reference numerals are used to denote the like or corresponding elements shown in FIG. 4 and 5, and the detailed description thereof is omitted for the sake of simplicity.

In the embodiment shown in FIG. 6 a RAM-A 48 and a RAM-B 43 share the function performed by the RAM 39 shown in FIG. 4. More specifically, in response to an address signal consisting of the input sampled value $x_i$ and the predicted value $x_i$, the RAM-A 48 has only the function of supplying a DPCM code to $y_i$ an output terminal 38 and is constituted by a RAM of $64K \times 4$ bits. The RAM-B 43 has a function similar to that of the RAM 43 of FIG. 5, that is, the RAM-B 43 receives as an address signal the DPCM code output from the RAM-A 48 and applies a local decoded signal to the D-type flip flop 37. Since the RAM-B 43 is constituted by a RAM of $4K \times 8$ bits, the memory capacity per DPCM coder in the coding device of this embodiment can be made smaller than that in the coding device shown in FIG. 4. In FIG. 1, the portion shown at 9a corresponds to the RAM-B 43, and the portion shown at 9b corresponds to the RAM-A 48.

The external storage device 49 is arranged to load predetermined tables into the RAM-A 48 and the RAM-B 43, respectively. In response to load signals input to a terminal 50, the external storage device 49 loads the individual tables into the corresponding RAM-A 48 and the RAM-B 43. In the external storage device 49, DPCM codes $y_i$ and local decoded values $\bar{x}_i$ corresponding to patterns of input sampled values $x_i$ and predicted values $x_i$, determined based upon the predetermined characteristics, are stored in advance, DPCM code $y_i$ being loaded to RAM-A 48, and local decoded value $\bar{x}_i$ being loaded to RAM-B 43.

The above description refers to first-order predictive DPCM for the purpose of illustration, but the range of application of the embodiment described above is not limited to first-order prediction. For example, the embodiment can be adapted to various other DPCM schemes based on higher-order prediction (e.g. second-order prediction, third-order prediction) and adaptive prediction. Furthermore, the embodiment can be adapted to a coding or decoding system whose code length can be arbitrarily determined.

Furthermore, although, in the above embodiment, an SRAM is used as RAM, a DRAM may be employed if the conditions required for refresh and cycle time are satisfied.

It will be appreciated from the foregoing that, in accordance with the present invention, it is possible to provide a coding and decoding system capable of effecting high-speed coding and decoding. Accordingly, the scale of hardware in the overall system can be reduced. In addition, since the algorithm of arithmetic operations required for coding and decoding can be altered by changing tables to be loaded into the RAM, the system of the invention can be adapted to a variety of applications by using an identical circuit arrangement. Accordingly, it is possible to construct a system which can be used for numerous purposes.

What is claimed is:

1. A predictive coding device, comprising:
   input means arranged to input a sampled value;
   predicting means for outputting a predicted value for said sampled value input through said input means; and
   look-up table means which includes a memory in which predictive coded values and local decoded values corresponding to sampled values and predicted values are memorized, arranged to read out a predictive coded value and a local decoded value from an address of said memory determined by said sampled value input through said input means and said predicted value output from said predicting means.

2. A device according to claim 1, wherein said predicting means outputs said predicted value on the basis of said local decoded value read out by said look-up table means.

3. A device according to claim 2, wherein said predicting means includes a delay circuit for delaying said local decoded value read out by said look-up table means to produce said predicted value.

4. A device according to claim 1, wherein said memory is a random access memory.

5. A device according to claim 1, wherein said memory is a read-only memory.

6. A predictive decoding device, comprising:
   input means arranged to input a predictive coded value;
   predicting means for outputting a predicted value for a sampled value corresponding to said predictive coded value input through said input means; and
   look-up table means which includes a memory in which decoded values corresponding to predictive coded values and predicted values are memorized, arranged to read out a decoded value from an address of said memory determined by said predictive coded value input through said input means and said predicted value output from said predicting means, said decoded values memorized in said memory being rewritable.

7. A device according to claim 6, wherein said predicting means includes a delay circuit for delaying said decoded value read out by said look-up table means to produce said predicted value.

8. A device according to claim 6, wherein said memory is a random access memory.

9. A predictive coding device, comprising:
   input means arranged to input a sampled value;
   predicting means for outputting a predicted value for said sampled value input through said input means;
   look-up table means which includes a random access memory in which predictive coded values corresponding to sampled values and predicted values are memorized, arranged to read out a predictive coded value from an address of said random access memory determined by said sampled value input through said input means and said predicted value output from said predicting means; and
   writing means for writing predictive coded values corresponding to sampled values and predicted values into said random access memory.

10. A device according to claim 9, wherein said writing means includes a storage device which stores said predictive coded values and means for instructing said storage device to load said predictive coded values into said random access memory.

11. A device according to claim 9, wherein local decoded values corresponding to sampled values and predicted values are further memorized in said random access memory, and said look-up table means is arranged to further read out a local decoded value from the address of said random access memory determined by said sampled value input through said input means and said predicted value output from said predicting means.

12. A device according to claim 11, wherein said predicting means outputs said predicted value on the basis of said local decoded value read out by said look-up table means.

13. A device according to claim 12, wherein said predicting means includes a delay circuit for delaying said local decoded value read out by said look-up table means to produce said predicted value.

14. A device according to claim 9, wherein said predicting means includes secondary look-up table means which includes a secondary random access memory in which local decoded values corresponding to sampled values and predicted values are memorized, arranged to read out a local decoded value from an address of said secondary random access memory determined by said sampled value input through said input means and said predicted value output from said predicting means.

15. A device according to claim 14, wherein said predicting means further includes a delay circuit for delaying said local decoded value read out by said secondary look-up table means to produce said predicted value.

16. A predictive decoding device, comprising:
input means arranged to input a predictive coded value;
predicting means for outputting a predicted value for a sampled value corresponding to said predictive coded value input through said input means;
look-up table means which includes a random access memory in which decoded values corresponding to predictive coded values and predicted values are memorized, arranged to read out a decoded value from an address of said random access memory determined by said predictive coded value input through said input means and said predicted value output from said predicting means; and
writing means for writing decoded values corresponding to predictive coded values and predicted values into said random access memory.

17. A device according to claim 16, wherein said predicting means includes a delay circuit for delaying said decoded value read out by said look-up table means to produce said predicted value.

* * * * *

UNITED STATES PATENT AND TRADEMARK OFFICE
CERTIFICATE OF CORRECTION

PATENT NO. : 4,995,059
DATED : February 19, 1991
INVENTOR(S) : HISASHI ISHIKAWA

Page 1 of 3

It is certified that error appears in the above-identified patent and that said Letters Patent is hereby corrected as shown below:

COLUMN 1

Line 29, "tractor 2" should read --tracter 2--.
    Line 33, "tractor 2" should read --tracter 2--.
    Line 39, "subtractor 2" should read --subtracter 2--.
    Line 44, "subtractor 2" should read --subtracter 2--.
    Line 68, "the," should read --the--.

COLUMN 2

Line 4, "most" should read --must--.
    Line 57, "drawing." should read --drawings.--.

COLUMN 3

Line 5, "coding" should read --coding device--.
    Line 27, "value $x_i$" should read --value $\hat{x}_i$--.
    Line 29, "value $x_i$" (2nd occ.) should read --value $\hat{x}_i$--.
    Line 34, "value $x_i$." should read --value $\hat{x}_i$.--.
    Line 38, "value $x_i$," should read --value $\hat{x}_i$,--.

COLUMN 4

Line 6, "value $x_i$" should read --value $\hat{x}_i$--.
    Line 10, "$(n-1x_i)$" should read --$(n-1\hat{x}_i)$--.
    Line 11, "to $-x_i$." should read --to $-\hat{x}_i$.--.
    Line 40, "device the" should read --device of the--.
    Line 50, "(first-order predicted value) $x_i$" should read --(first-order predicted value) $\hat{x}_i$--.

UNITED STATES PATENT AND TRADEMARK OFFICE
CERTIFICATE OF CORRECTION

PATENT NO. : 4,995,059
DATED : February 19, 1991
INVENTOR(S) : HISASHI ISHIKAWA

It is certified that error appears in the above-identified patent and that said Letters Patent is hereby corrected as shown below:

COLUMN 4

Line 57, "value $x_i$." should read --value $\hat{x}_i$.--.
Line 65, "value $x_i$" should read --value $\hat{x}_i$--.

COLUMN 5

Line 1, "ROM 42" should read --ROM 22--.
Line 23, "value $x_i$" should read --value $\hat{x}_i$--.
Line 26, "value $x_i$" should read --value $\hat{x}_i$--.
Line 27, "an" should read --a--.
Line 29, "values $x_i$" should read --values $\bar{x}_i$--.
Line 30, "values $x_i$," should read --values $\hat{x}_i$,--.
Line 50, "value $x_i$," (2nd. occ.) should read --value $\hat{x}_i$--.
Line 51, "output" should read --outputs a--.

COLUMN 6

Line 34, "value $x_i$" should read --value $\hat{x}_i$--.
Line 41, "values $x_i$" should read --values $\hat{x}_i$--.
Line 47, "value $x_i$" should read --value $\hat{x}_i$--.
Line 52, "value $x_i$." should read --value $\hat{x}_i$.--.
Line 55, "value $x_i$" should read --value $\hat{x}_i$--.

UNITED STATES PATENT AND TRADEMARK OFFICE
CERTIFICATE OF CORRECTION

PATENT NO. : 4,995,059
DATED : February 19, 1991
INVENTOR(S) : HISASHI ISHIKAWA

It is certified that error appears in the above-identified patent and that said Letters Patent is hereby corrected as shown below:

COLUMN 7

Line 9, "value $x_i$," should read --value $\hat{x}_i$,--.
Line 10, "to $y_i$" should read --$y_i$ to--.
Line 31, "values $x_i$," should read --values $\hat{x}_i$,--.

Signed and Sealed this

Ninth Day of February, 1993

Attest:

STEPHEN G. KUNIN

Attesting Officer      Acting Commissioner of Patents and Trademarks